United States Patent
Kang et al.

(10) Patent No.: US 7,382,641 B2
(45) Date of Patent: Jun. 3, 2008

(54) FERAM FOR HIGH SPEED SENSING

(75) Inventors: Hee Bok Kang, Daejeon (KR); Dong Yun Jeong, Chungcheongbuk-do (KR); Jae Hyoung Lim, Chungcheongbuk-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 49 days.

(21) Appl. No.: 10/879,121

(22) Filed: Jun. 30, 2004

(65) Prior Publication Data

US 2005/0141258 A1  Jun. 30, 2005

(30) Foreign Application Priority Data

Dec. 26, 2003  (KR) ........................ 10-2003-0097450

(51) Int. Cl.
*G11C 11/22* (2006.01)
*G11C 5/06* (2006.01)

(52) U.S. Cl. .................... 365/145; 365/149; 365/63

(58) Field of Classification Search ................ 365/145, 365/149, 230.03, 51, 63, 205, 207, 208
See application file for complete search history.

(56) References Cited

U.S. PATENT DOCUMENTS

| | | | | |
|---|---|---|---|---|
| 5,682,343 A * | 10/1997 | Tomishima et al. | ........... | 365/63 |
| 5,917,744 A * | 6/1999 | Kirihata et al. | ................ | 365/63 |
| 5,973,983 A * | 10/1999 | Hidaka | ................... | 365/230.03 |
| 6,188,596 B1 * | 2/2001 | Holst | ............................ | 365/63 |
| 6,272,594 B1 | 8/2001 | Gupta et al. | | |
| 6,292,385 B1 * | 9/2001 | Kim | ............................ | 365/145 |
| 6,314,042 B1 * | 11/2001 | Tomishima et al. | ..... | 365/230.03 |
| 6,363,439 B1 | 3/2002 | Battles et al. | | |
| 6,480,437 B2 * | 11/2002 | Kato et al. | .............. | 365/230.03 |
| 6,574,135 B1 * | 6/2003 | Komatsuzaki | .............. | 365/145 |

FOREIGN PATENT DOCUMENTS

KR  1998-14400  7/2000

* cited by examiner

*Primary Examiner*—Trong Phan
(74) *Attorney, Agent, or Firm*—Townsend and Townsend and Crew LLP

(57) ABSTRACT

A non-volatile ferroelectric memory device senses a cell data at high speed. Preferably, the non-volatile ferroelectric memory device includes a plurality of cell array blocks, a plurality of sense amplifier units, a plurality of sense amplifier units, a plurality of local data buses, a global data bus, and a plurality of data bus switch arrays. Each of the plurality of cell array blocks has a hierarchical bit line architecture including sub bit lines and a main bit line group corresponding to a plurality of unit cells for storing differential data. The plurality of sense amplifier units, corresponding one-by-one to the cell array blocks, sense and amplify the differential data induced on the main bit line group during a sensing operation. The plurality of local data buses, corresponding one-by-one to the sense amplifier units, transfer the differential data outputted from the sense amplifier units and differential data to be transferred to the sense amplifier units. The global data bus, shared by a plurality of the local data buses, transfers the differential data. The plurality of data bus switch arrays selectively couple the local data buses to the global data bus.

4 Claims, 9 Drawing Sheets

FERAM FOR HIGH SPEED SENSING

BACKGROUND OF THE INVENTION

1. Field of the Invention

The present invention relates to a non-volatile ferroelectric memory device for driving a memory at high speed, and more specifically, to a non-volatile ferroelectric memory device, in which a 1T1C embedded memory cell is operated as a 2T2C embedded memory cell and a sensing voltage of a main bit line is directly applied to a sense amplifier, thereby performing a high-speed sensing operation and improving operating characteristics at a low voltage.

2. Description of the Related Art

Generally, a ferroelectric random access memory (hereinafter, referred to as 'FeRAM') has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents of the above FeRAM are disclosed in the Korean Patent Application No. 1998-14400 applied for a patent by the same inventor of the present invention. Therefore, the basic structure and the operation of the FeRAM are not described herein.

As the chip operation voltage of the FeRAM becomes lower, the cell sensing voltage also decreases. As a result, it is difficult to embody the rapid operating operation speed in a FeRAM chip having a 1T1C (1-Transistor 1-Capacitor) structure.

Specifically, when the sensing voltage of cell data is small, it is difficult to sense cell data at high speed due to the reduced voltage margin.

SUMMARY OF THE INVENTION

It is, therefore, an object of the present invention to provide a FeRAM for sensing cell data at high speed by improving the architecture of a memory device and thus, improving a sensing voltage margin.

In an embodiment, a non-volatile ferroelectric memory device for sensing cell data at high speed comprises a plurality of cell array blocks, a plurality of sense amplifier units, a plurality of local data buses, a global data bus, and a plurality of data bus switch arrays. Each of the plurality of cell array blocks has a hierarchical bit line architecture including a plurality of main bit lines and a plurality of sub bit lines. Here, a plurality of main bit lines corresponding to a plurality of unit cells for storing differential data form a main bit line group. The plurality of sense amplifier units, corresponding one-by-one to the cell array blocks, sense and amplify the differential data induced on the main bit line groups during a sensing operation. The plurality of local data buses, corresponding one-by-one to the sense amplifier units, transfer the differential data outputted from the sense amplifier units and differential data to be transferred to the sense amplifier units. The global data bus, shared by a plurality of the local data buses, transfers the differential data. The plurality of data bus switch arrays selectively couple the local data buses to the global data bus.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

The present invention will be described in detail with reference to the accompanying drawings.

Figure 1:
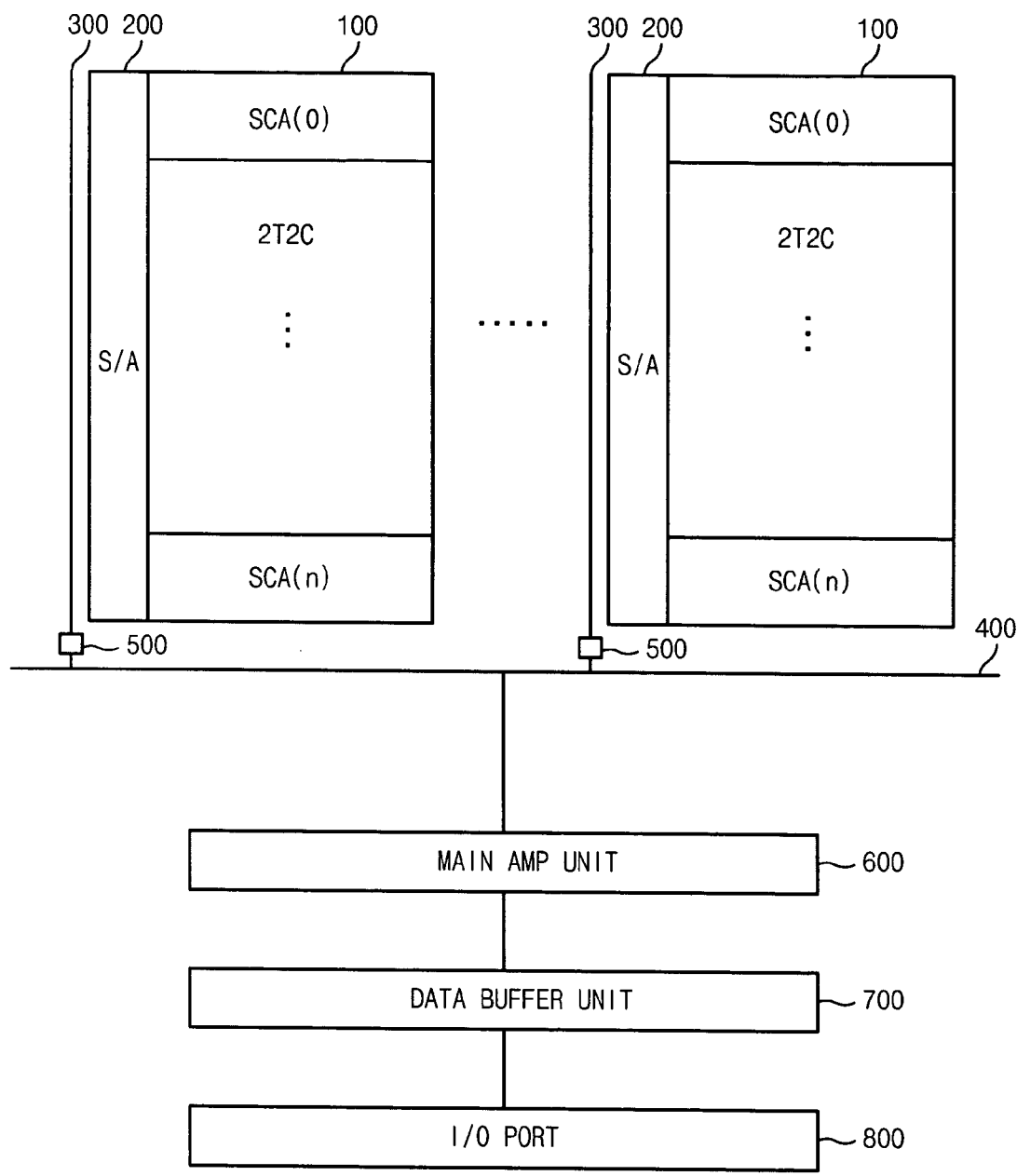
FIG. 1 is a schematic diagram of a non-volatile ferroelectric memory device according to a first embodiment of the present invention.

FIG. 1 is a schematic diagram of a non-volatile ferroelectric memory device according to a first embodiment of the present invention.

In an embodiment, the ferroelectric memory device includes a plurality of cell array blocks 100, a plurality of sense amplifier units 200, a plurality of local data buses 300, a global data bus 400, a plurality of data bus switches 500, a main amplifier 600, and a data bus 700.

The cell array block 100 consists of a plurality of sub cell arrays SCA(0)-SCA(n) for storing differential data. More specifically, each sub cell array SCA(0)-SCA(n) does not store one data with one unit cell, but stores one data with a plurality of unit cells (e.g., two unit cells in the embodiment) corresponding to a plurality of adjacent main bit lines (e.g., two main bit lines in the embodiment). Moreover, each cell array block 100 has a hierarchical bit line architecture including a plurality of main bit lines and a plurality of main bit lines. In the hierarchical architecture, a voltage of the sub bit line induced by cell data is converted into current so that a sensing voltage of the main bit line is induced. Here, sub bit lines correspond to the respective sub cell arrays SCA(0)-SCA(n), but the main bit line is shared by the entire sub cell arrays SCA(0)-SCA(n).

The sense amplifier unit 200 receives the sensing voltage induced to two adjacent main bit lines in the cell array block 100 to sense differential data, and selectively outputs the sensed differential data (i.e. read data) to the local data buses 300. Also, the sense amplifier unit 200 transfers each differential data (i.e. write data) applied through the local data buses 300 to two corresponding main lines in the cell array block 100. The sense amplifier unit 200 is located between the cell array block 100 and the local data bus line 300, respectively, to correspond one-by-one to the cell array block 100, and its input/output (I/O) port at one side is directly connected to the main bit line, thereby directly sensing the voltage on the main bit line.

The local data buses 300 transfer the read data sensed by the sense amplifier unit 200 to the global data bus 400, and transfer the write data applied through the global data bus 400 to the sense amplifier unit 200. The local data bus 300 is positioned at one side of the sense amplifier unit 200 to correspond one-by-one to the cell array block 100. Also, the local data bus 300 includes a certain number of bus lines corresponding to the number of bits inputted or outputted at the same time with a one-time column selection. The local data buses 300 are selectively coupled to the global data bus 400 depending on on/off operation of the data bus switch 500, thereby sharing the global data bus 400.

The global data bus 400 transfers the read data applied from the local data buses 300 to the main amplifier unit 600, and transfers the write data applied from the main amplifier 600 to the local data bus 300.

The main amplifier unit 600 amplifies the read data applied from the global data bus 400 to transfer the amplified data to the data buffer unit 700, and amplifies the write data applied through the data buffer unit 700 to transfer the amplified data to the global data bus 400.

The data buffer unit 700 buffers the read data to be outputted outside to transfer the buffered data to an I/O port 800, and buffers the read data inputted through the I/O port 800 from outside to transfer the buffered data to the main amplifier unit 600.

Figure 2:
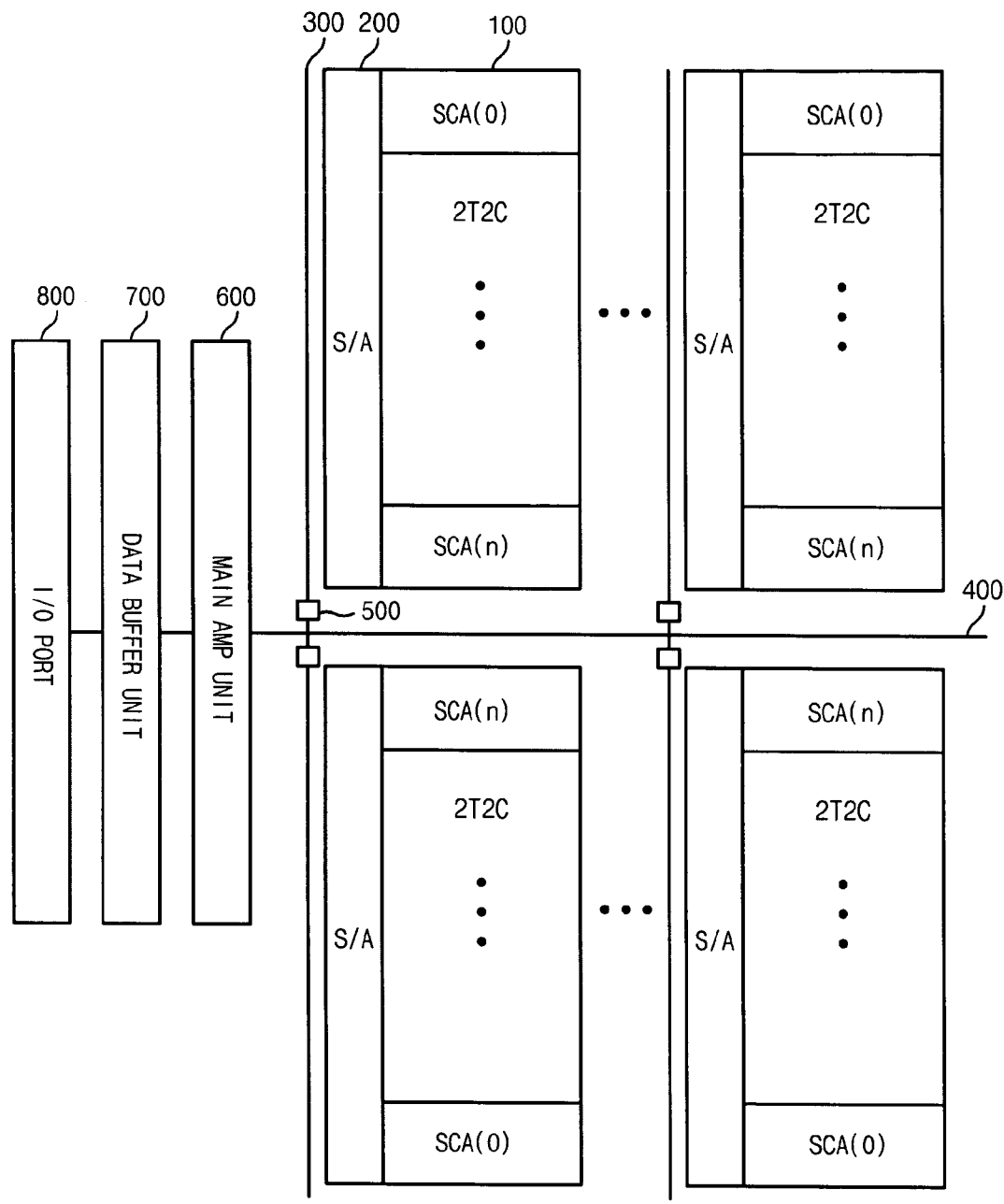
FIG. 2 is a schematic diagram of a non-volatile ferroelectric memory device according to a second embodiment of the present invention.

FIG. 2 is a schematic block diagram of a non-volatile ferroelectric memory device according a second embodiment of the present invention.

In this embodiment shown in FIG. 2, the cell array blocks 100 are divided into two groups (upper cell array blocks and lower cell array blocks) to be vertically symmetric by the global data bus 400. And, in each cell array block 100, the sense amplifier unit 200 corresponds one-by-one the local data bus 300 as shown in FIG. 1.

The upper and lower local data buses 300 share the global data bus 400 depending on the on/off operation of the data bus switch 500.

The structure and operation of the other elements are the same as those in FIG. 1.

Figure 3:
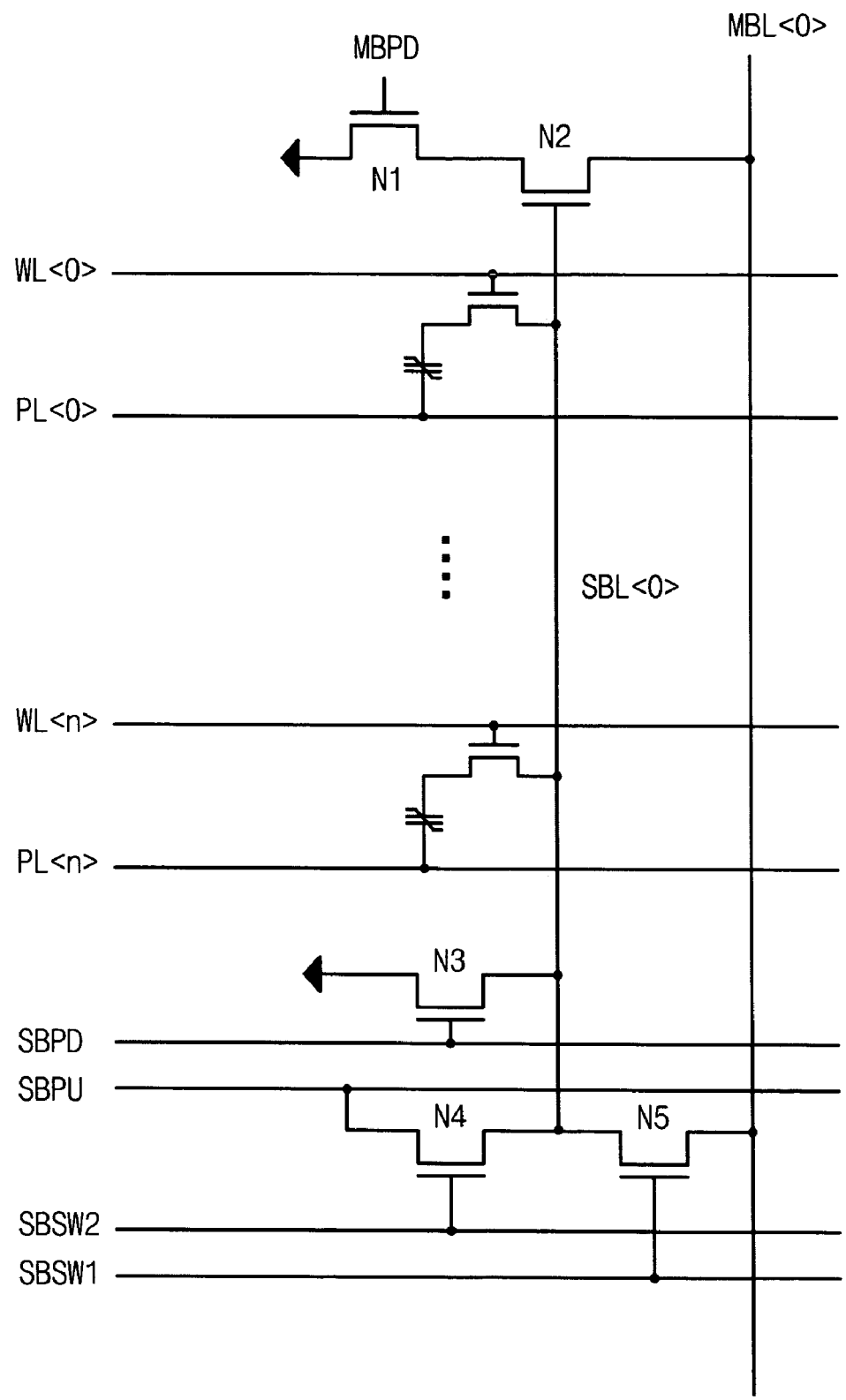
FIG. 3 is a circuit diagram illustrating a multi-bit line architecture of sub cell arrays in FIG. 1 and FIG. 2.

FIG. 3 is a circuit diagram illustrating a multi-bit line architecture of sub cell arrays SCA(0)-SCA(n) shown in FIG. 1 and FIG. 2.

One main bit line MBL is shared by the sub cell arrays SCA(0)-SCA(n), and sub bit lines are respectively provided to the sub cell arrays SCA(0)-SCA(n) to share one main bit line MBL.

Particularly, FIG. 3 illustrates a connection relation between one main bit line MBL<0> and a sub bit line SBL<0>, one of sub bit lines sharing the main bit line MBL<0>.

When an NMOS transistor N5 is turned on after a sub bit line selection signal SBSW1 is activated, a load on the main bit line MBL<0> is adjusted to one sub bit line level. In addition, when an NMOS transistor N3 is turned on after a sub bit line pull-down signal SBPD is activated, the sub bit line SBL<0> is adjusted to the ground voltage level.

A sub bit line pull-up signal SBPU is a signal for adjusting power supply to the sub bit line SBL<0>, and a sub bit line selection signal SBSW2 is a signal for adjusting the sub bit line pull-up signal SBPU to be applied to the sub bit line SBL<0>. For example, to generate a high voltage to the sub bit line SBL<0>, a higher voltage than the power voltage VCC is supplied as the sub bit line pull-up signal SBPU. Then, the sub bit line selection signal SBSW2 is activated. Following the activation of the sub bit line selection signal SBSW2, an NMOS transistor N4 is turned on and a high voltage is supplied to the sub bit line SBL<0>.

And, a plurality of unit cells are connected to the sub bit line SBL<0>.

An NMOS transistor N1 is connected between the ground voltage node and an NMOS transistor N2 and has a gate to receive a main bit line pull-down signal MBPD. An NMOS transistor N2 is connected between the NMOS transistor N1 and the main bit line MBL<0> and has a gate connected to the sub bit line SBL<0>. When the main bit line pull-down signal MBPD is activated, the NMOS transistor N2 adjusts, depending on the sensing voltage on the sub bit line SBL<0>, the amount of current flowing from the main bit line MBL<0> to the ground voltage to induce a sensing voltage on the main bit line MBL<0>. For example, the voltage level of the sub bit line SBL<0> is more raised when the data value in the cell is high than when the data value in the cell is low and thus, the amount of current flowing through the NMOS transistor N2 becomes larger. As a result, the voltage level of the main bit line MBL<0> is reduced to a great degree. On the contrary, the voltage level of the sub bit line SBL<0> is less raised when the data value in the cell is low than when the data value in the cell is high and thus, the amount of current flowing through the NMOS transistor N2 becomes smaller. In this case, however, the voltage level of the main bit line MBL<0> is reduced only slightly. In short, the voltage level of the main bit line MBL varies depending on the cell data. Based on this mechanism, therefore, data in a selected cell sensed.

Figure 4:
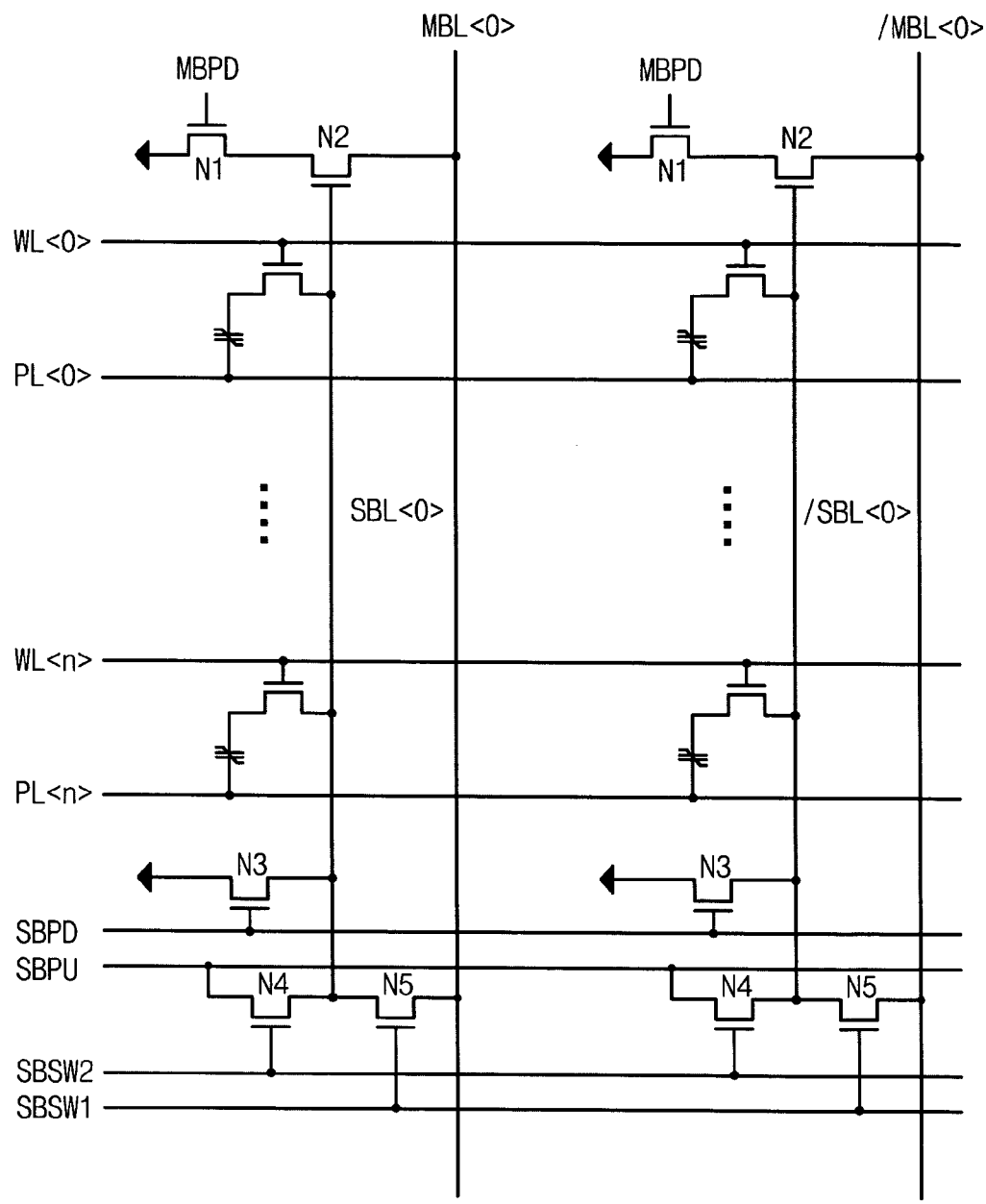
FIG. 4 illustrates the structure of a sub cell array in correspondence to a main bit line group, for storing differential data.

Especially, as shown in FIG. 4, each of the sub cell arrays SCA(0)-SCA(n) has a pair of two main bit lines MBL<0>, /MBL<0>, and two cells that are positioned in the same location to these two main bit lines MBL<0>, /MBL<0> store differential data. That is, two unit cells (2T2C), not one unit cell (1T1C), are used to store one data.

Figure 5:
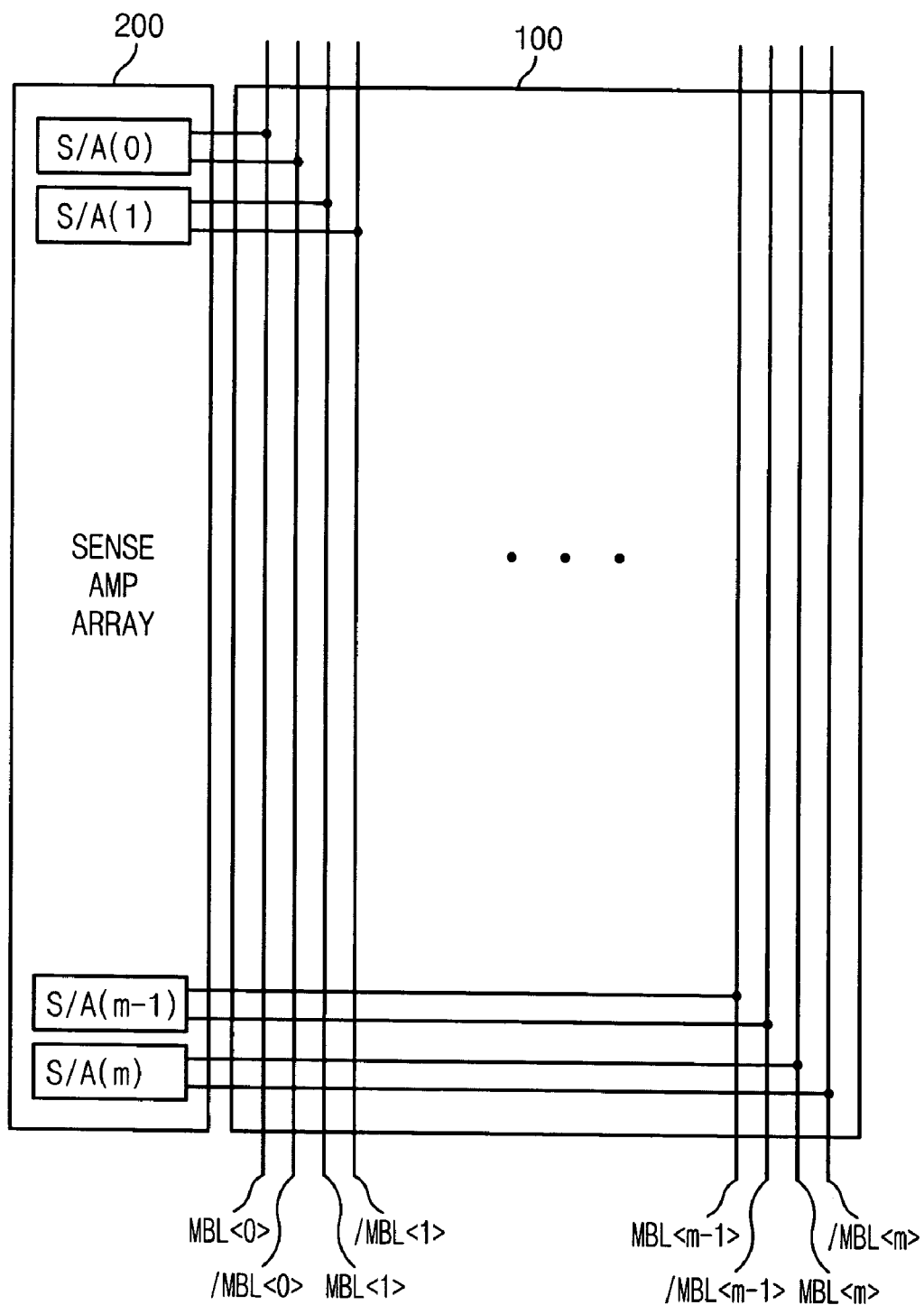
FIG. 5 is a schematic diagram illustrating a connection relation between main bit line groups and sense amplifier units in a cell array block.

FIG. 5 is a schematic diagram illustrating a connection relation between main bit lines MBL<0>, /MBL<0>/ MBL<0>-MBL<m>, /MBL<m> in the cell array block 100 and the sense amplifier unit 200.

In each cell array block 100, a plurality of main bit line groups MBL<0>, /MBL<0>-MBL<m>, /MBL<m> for reading and writing differential data are aligned vertically in parallel with each other.

The sense amplifier unit 200 consists of a plurality of sense amplifiers S/A<0>-S/A<m>, directly connected to the respective main bit line groups MBL<0>, /MBL<0>-MBL<m>, /MBL<m>.

Each sense amplifier S/A<0>-S/A<m> receives the sensing voltage induced on its corresponding main bit line group MBL<0>, /MBL<0>-MBL<m>,/MBL<m> and senses the differential data.

Figure 6:
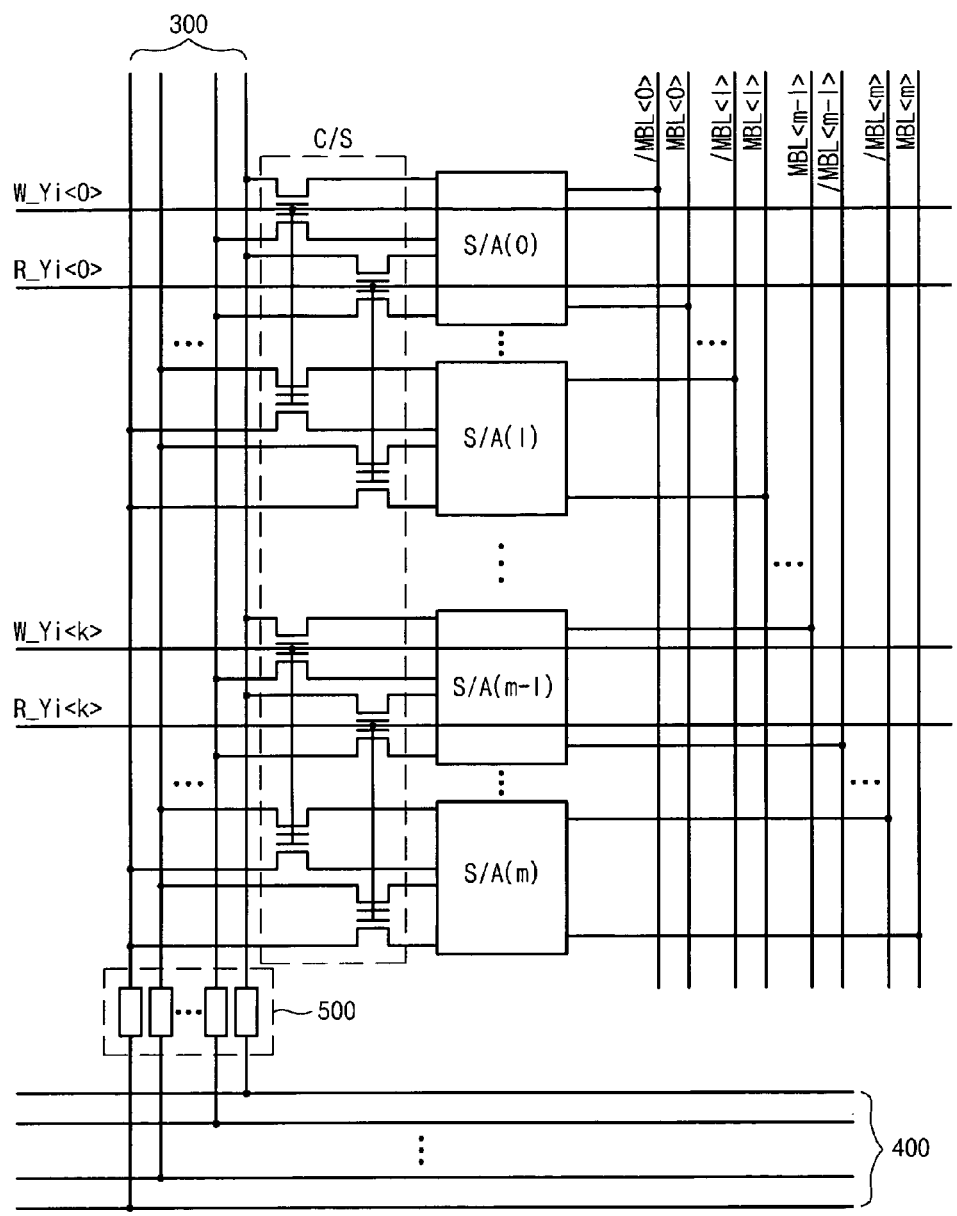
FIG. 6 is a schematic diagram illustrating in detail the relation between a sense amplifier unit and a data bus.

FIG. 6 is a schematic diagram elaborating the relation between the sense amplifier unit 200 and data buses 300, 400.

One side terminal of each sense amplifier S/A<0>-S/A<m> is directly connected to the respective main bit lines MBL<0>, /MBL<0>-MBL<m>, /MBL<m>, and the other side terminal of each sense amplifier S/A<0>-S/A<m> is connected to the local data bus 300 through a column selection switch C/S.

In the read mode, each sense amplifier S/A<0>-S/A<m> receives sensing voltages induced on its corresponding main bit line group MBL<0>, /MBL<0>-MBL<m>, /MBL<m>, and senses differential data. And, each sense amplifier S/A<0>-S/A<m> outputs the sensed differential data to the local data bus 300 in response to a column selection signal Yi<0>-Yi<k>. Also, the sense amplifier S/A<0>-S/A<m> transfers the sensed differential data back to the main bit line groups MBL<0>, /MBL<0>-MBL<m>, /MBL<m> for restoring the data therein.

In the write mode, each sense amplifier S/A<0>-S/A<m> transfers the differential data (i.e. the write data) applied from the local data bus 300 to the main bit line groups MBL<0>, /MBL<0>-MBL<m>, /MBL<m> in response to the column selection signals Yi<0>-Yi<K> so that the differential data may be written in the cell array block 100. At this time, the number of the column selection switches C/S to receive the same column selection signal Yi<0>-Yi<K> is equivalent to that of bits in a data that are inputted or outputted at the same time with a one-time column selection.

The local data bus 300 is selectively coupled to the global data bus 400 through the data bus switch 500.

Figure 7:
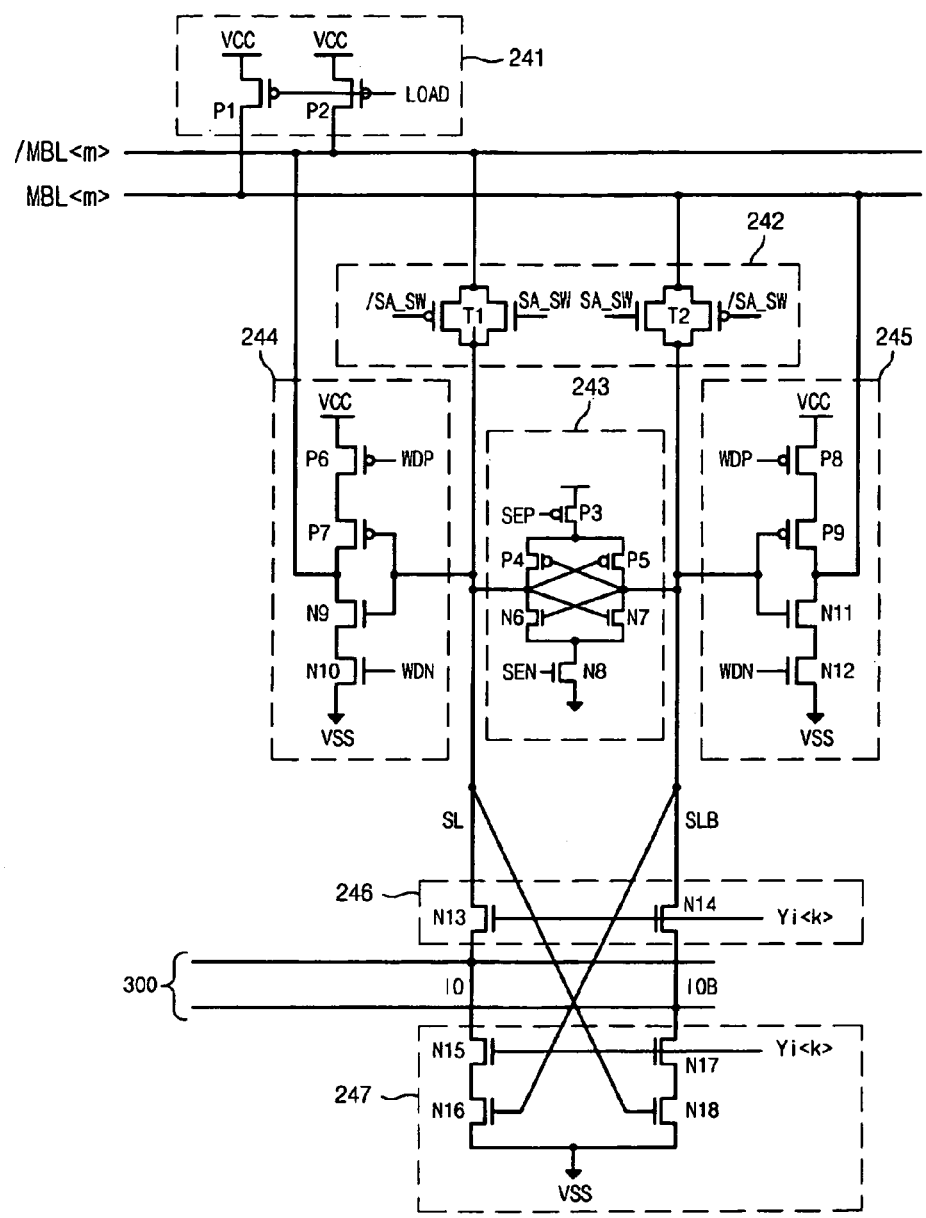
FIG. 7 is a circuit diagram illustrating in detail the structure of the sense amplifier in FIG. 6.

FIG. 7 is a detailed circuit diagram illustrating the structure of each sense amplifier S/A<0>-S/A<m> in FIG. 6.

Each sense amplifier S/A<0>-S/A<m> consists of a main bit line sensing load unit 241, a sense amplifier switch unit 242, a data latch unit 243, a first write driving unit 244, a second write driving unit 245, a write selection unit 246, and a read selection unit 247.

The main bit line sensing load unit 241 controls a sensing load on the main bit line groups MBL<m>, /MBL<m> in response to a load signal LOAD.

The main bit line sensing load unit 241 includes PMOS transistors P1 and P2 connected between the power voltage VCC and the main bit line group MBL<m>, /MBL<m>, respectively, and having a gate to receive the sensing load signal LOAD.

The sense amplifier switch unit 242, being activated in a read mode in response to a sense amplifier switch signal SA_SW, transfers the sensing voltages induced on the main bit line group MBL<m>, /MBL<m> to the data latch unit 243. The sense amplifier switch signal SA_SW is activated before sensing control signals SEN, SEP are activated. A sense amplifier switch signal/SA SW is an inverse signal of the sense amplifier signal SA SW.

The sense amplifier switch unit 242 includes transmission gates T1 and T2. The transmission gate T1 which is connected between a main bit line /MBL<m> and a node SL is turned on/off in response to the sense amplifier switch signal SA_SW. The transmission gate T2 which is connected between a main bit line MBL<m> and a node SLB is turned on/off in response to the sense amplifier switch signal SA_SW.

The data latch unit 243, being activated by the sensing control signals SEN and SEP, senses differential data of the main bit line group MBL<m>, /MBL<m> transferred through the sense amplifier switch unit 242, and latches the data.

The data latch unit 243 consists of a pair of PMOS transistors P4 and P5 and a pair of NMOS transistors N6 and N7, each pair having a cross-coupled latch circuit structure, and a PMOS transistor P3 and an NMOS transistor N8 which activate the latch circuit when the sensing control signals SEP and SEN are activated.

The first write driving unit 244 is activated in response to write control signals WDN, WDP during a data write operation or a restore operation, and transfers stored data in the data latch unit 245 to the main bit line /MBL<m>.

The first write driving unit 244 consists of PMOS transistors P6 and P7 which are serially connected between a power voltage VCC and the main bit line /MBL<m>, and NMOS transistors N9 and N10 which are connected between the main bit line /MBL<m> and a ground voltage VSS. Here, the write control signals WDP and WDN are respectively applied to the gate of the PMOS transistors P6 and the gate of the NMOS transistor N10. The gate of the PMOS transistor P7 and the gate of the NMOS transistor N9 are commonly connected to the node SL.

The second write driving unit 245 is activated by write control signals WDN and WDP during a data write operation or a data restore operation, and transfers stored data in the data latch unit 245 to the main bit line MBL<m>.

The second write driving unit 245 consists of PMOS transistors P8 and P9 which are serially connected between a power voltage VCC and the main bit line MBL<m>, and NMOS transistors N11 and N12 which are connected between the main bit line MBL<m> and a ground voltage VSS. Here, the write control signals WDP and WDN are respectively applied to the gate of the PMOS transistors P8 and the gate of the NMOS transistor N12. The gate of the PMOS transistor P9 and the gate of the NMOS transistor N11 are commonly connected to the node SLB.

The write selection unit 246 transfers a write data applied from the local data bus 300 to the data latch unit 240, in response to a write column selection signal Yi<k>.

The write selection unit 246 consists of NMOS transistors N13 and N14. The NMOS transistor N13, which is connected between the node SL and an input/output port IO, has a gate to receive the write column selection signal Yi<k>. The NMOS transistor N14, which is connected between the node SLB and an input/output port IOB, has a gate to receive the write column selection signal Yi<k>.

The read selection unit 247, on the other hand, transfers a data stored in the data latch unit 243 to the local data bus 300, in response to a read column selection signal Yi<k>.

The read selection unit 247 consists of NMOS transistors N15 and 16 serially connected between the input/output port IO and the ground voltage VSS, and NMOS transistors N17 and N18 serially connected between the input/output port IOB and the ground voltage VSS. Here, a read column selection signal Yi<k> is respectively applied to the gate of the NMOS transistors N15 and N17. The gate of the NMOS transistor N16 and the gate of the NMOS transistor N18 are connected to the node SLB and the node SL, respectively.

Figure 8:
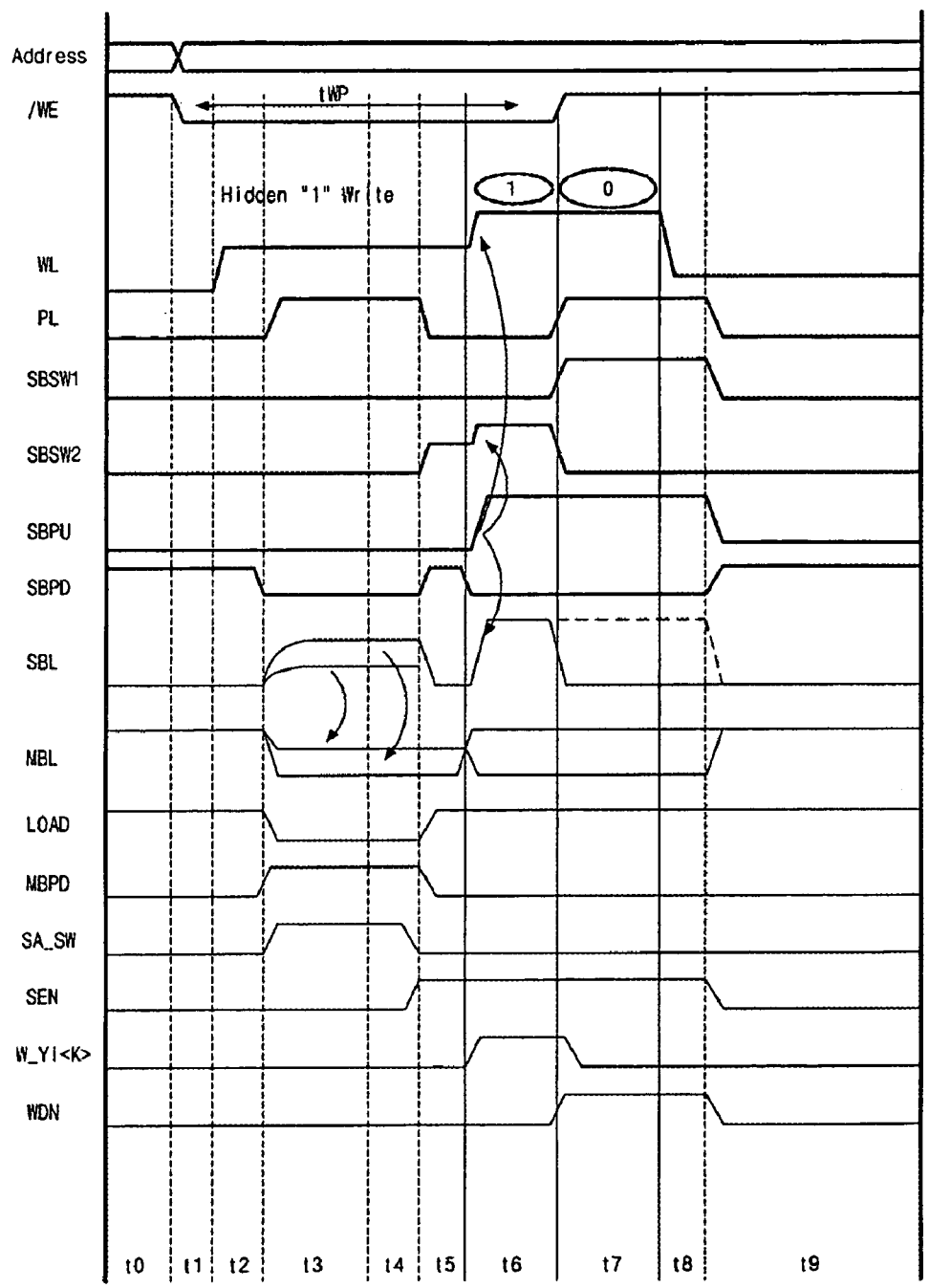
FIG. 8 is a timing diagram for explaining a write operation in a non-volatile ferroelectric memory device according to the present invention.

FIG. 8 is a timing diagram for describing a write operation of the non-volatile ferroelectric memory device according to the present invention.

In period t0, when the address is transmitted and the write enable signal /WE is inactivated to a low level, the memory device is put in a write mode active state.

In periods t0 and t1, the sub bit line pull-down signal SBPD is activated before the word line WL and the plate line PL are activated, so the sub bit line SB1 is pulled down.

In period t2, the word line WL is enabled and the sub bit line pull-down signal SBPD is disabled to low, so that the storage node of a cell is initialized to a ground level. Here, since the word line WL is activated earlier than the plate line PL for a predetermined time, the state of the cell storage node is stabilized at the initial operation, thereby improving the sensing margin.

Periods t3 and t4 are sensing periods. When the plate line PL is activated in period t3, cell data are applied to the sub bit line SBL. Accordingly, the sensing voltage on the sub bit line SBL goes to different levels depending on the cell data. When the NMOS transistor N2 is turned on due to the voltage increase on the sub bit line SBL after the main bit line pull-down signal MBPD has been activated, the sensing voltage on the main bit line MBL goes down from its pre-charged high level.

At this time, the sense amplifier switch signal SA_SW is activated and thus, the voltage (differential data) on the main bit line group MBL<m>, /MBL<m> is applied to the data latch unit 243 through the sense amplifier switch unit 242.

Entering period t5, the sensing control signal SEN is activated and then the data latch unit 243 is activated. As a result, the differential data applied through the sense amplifier switch unit 242 are sensed and latched.

Further, the voltage level of the plate line PL is inactivated to 'low' and the sub bit line selection signal SBSW2 is activated. And, the sub bit line pull-down signal SBPD is activated to 'high' so that the voltage on the sub bit line SBL goes down to the ground level.

In period t6, a high voltage is applied as the sub bit line pull-up signal SBPU and the sub bit line selection signal SBSW2 is pumped. Then the voltage level of the sub bit line SBL goes up to a pumping voltage VPP level. Therefore, regardless of an external data, a high data (Hidden "1") is written in every cell coupled to the activated word line WL.

Also, the write column selection signal W_Yi<k> is activated and the data latch unit 240 latches the data applied through the local data bus 300.

In period t7, when the write enable signal /WE and the write control signals WDN and WDP are activated, the stored differential data in the data latch unit 243 are transferred to the main bit line group MBL<m>, /MBL<m>. The differential data of the main bit line group MBL<m>, /MBL<m> are then transferred to a pair of sub bit lines SBL<0>, /SBL<0> by the activated sub bit line selection signal SBSW1. In other words, while the sub bit line selection signal SBSW1 is activated, the differential data applied through the local data bus 300 are applied to the main bit line group MBL<m>, /MBL<m> and the sub bit line pair SBL<0>, /SBL<0>, and are written in a cell. At this time, if the data of the sub bit line SBL is 'high', the data Hidden "1" written during the period t6 is kept. If the data of the sub bit line SBL is 'low', however, a low data is written in a corresponding cell. That is, in period t7 the data "0" is written. The write operation then concludes in periods t8 and t9.

Figure 9:
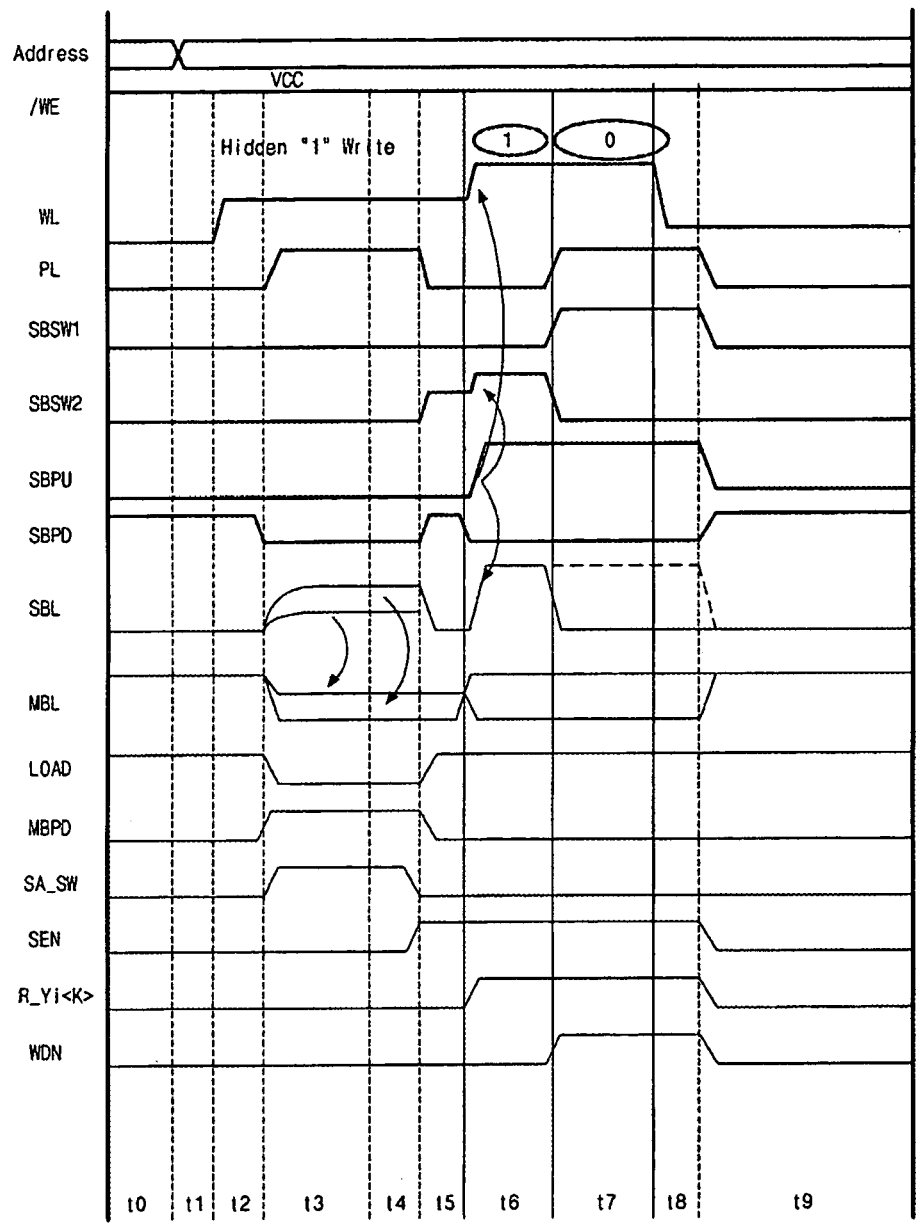
FIG. 9 is a timing diagram for explaining a read operation in a non-volatile ferroelectric memory device according to the present invention.

FIG. 9 is a timing diagram for describing a read operation of the non-volatile ferroelectric memory device according to the present invention.

In the read mode, the write enable signal /WE maintains the power voltage level.

In period T6, the read column selection signal R_Yi<k> is activated, so that the stored data in the data latch unit 243 are transferred to the local data bus 300.

After a data sensing operation is completed, in period T7, the write control signal WDN is activated, so the stored data in the data latch unit 243 are transferred to the main bit line group MBL<m>, /MBL<m>. At this time, the write column selection signal W_Yi<k> is maintained at a low level, so the data inputted through the local data bus 300 are blocked and the read data stored in the data latch unit 243 are restored.

In periods of t6-t8, if the read column selection signal R-Yi<k> is activated, the stored data in the data latch unit 240 are transferred to the local data bus 300.

After restoring data is completed, the word line WL is inactivated before than the plate line PL is inactive. The write operation concludes in period t9.

Accordingly, in a non-volatile ferroelectric memory device for sensing cell data at high speed according to an embodiment of the present invention, a 1T1C embedded memory cell is operated as a 2T2C embedded memory cell. As a result, differential data are stored and sensed in two unit cells so that a sensing voltage on a main bit line is directly applied to a sense amplifier, thereby performing a high-speed data sensing operation and improving operational characteristics of the memory device at low voltage.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A non-volatile ferroelectric memory device comprising:
a plurality of cell array blocks each having a hierarchical bit line architecture including a plurality of main bit lines and a plurality of sub bit lines, wherein a voltage of a sub bit line induced by cell data is converted into current so that a sensing voltage of a main bit line is induced, the plurality of cell array blocks including main bit line groups each corresponding to a plurality of unit cells for storing differential data;
a plurality of lines connected one by one to the plurality of main bit lines;
a plurality of sense amplifier units connected one by one to the plurality of main bit lines through the plurality of lines, for sensing and amplifying the differential data outputted from the main bit line groups in a sensing operation;
a plurality of local data buses, corresponding one by one to the plurality of sense amplifier units, for transferring the differential data outputted from the plurality of sense amplifier units and transmitting the differential data inputted to the plurality of sense amplifier units; and
a global data bus, shared by the plurality of local data buses, for transferring the differential data,
wherein the plurality of sense amplifier units, respectively, comprises:
a main bit line sensing load unit for controlling a sensing load of the main bit line groups in response to a load signal;
a sense amplifier switch unit, being turned on in read mode in response to a sense amplifier switch signal, for transferring the sensing voltage induced on the main bit line groups;
a data latch unit, being activated in response to a sensing control signal, for sensing the sensing voltage on the main bit line groups which is transferred through the sense amplifier switch unit to latch the differential data;
a write driving unit, being activated in response to a write control signal in write mode or restore mode, for transferring the differential data stored in the data latch unit to the main bit line groups; and
a write selection unit for transferring the differential data applied from the plurality of local data buses to the data latch unit in response to a column selection signal; and
a read selection unit for transferring the differential data stored in the data latch unit to the plurality of local data buses in response to the column selection signal.

2. The device according to claim 1, wherein the main bit line groups comprises two adjacent main bit lines.

3. The device according to claim 1, wherein the plurality of sense amplifier units corresponding one-by-one to the main bit line groups comprises a plurality of sense amplifiers for sensing the differential data of the main bit line groups and transferring the sensed differential data to the plurality of local data buses in response to a column selection signal.

4. The device according to claim 1, wherein the write driving unit comprises:

a first write driving unit, being activated in response to the write control signal, for transferring a first data of the differential data latched by the data latch unit to a first main bit line of the main bit line groups; and a second write driving unit, being activated in response to the write control signal, for transferring a second data of the differential data latched by the data latch unit to a second main bit line of the main bit line groups.

* * * * *